(12) United States Patent
Ichinoseki et al.

(10) Patent No.: US 12,713,649 B2
(45) Date of Patent: Aug. 18, 2026

(54) SEMICONDUCTOR DEVICE AND METHOD FOR MANUFACTURING SAME

(71) Applicants: Kabushiki Kaisha Toshiba, Tokyo (JP); Toshiba Electronic Devices & Storage Corporation, Tokyo (JP)

(72) Inventors: Kentaro Ichinoseki, Tokyo (JP); Keiko Kawamura, Yokohama Kanagawa (JP); Tatsuya Nishiwaki, Yokohama Kanagawa (JP); Kohei Oasa, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 725 days.

(21) Appl. No.: 18/105,164

(22) Filed: Feb. 2, 2023

(65) Prior Publication Data

US 2024/0097022 A1 Mar. 21, 2024

(30) Foreign Application Priority Data

Sep. 20, 2022 (JP) ................................ 2022-148731

(51) Int. Cl.
*H10D 30/66* (2025.01)
*H10D 30/01* (2025.01)
(Continued)

(52) U.S. Cl.
CPC ....... *H10D 30/668* (2025.01); *H10D 30/0297* (2025.01); *H10D 64/117* (2025.01); *H10D 64/513* (2025.01)

(58) Field of Classification Search
CPC ............ H10D 30/668; H10D 30/0297; H10D 64/117; H10D 64/513; H10D 62/115; H10D 62/127; H10D 64/518; H10D 64/519
See application file for complete search history.

(56) References Cited

U.S. PATENT DOCUMENTS 5,126,807 A 6/1992 Baba et al.
8,563,987 B2 10/2013 Sorada
(Continued)

FOREIGN PATENT DOCUMENTS

JP H04-229662 A 8/1991
JP 2017-162909 A 9/2017
(Continued)

OTHER PUBLICATIONS

Office Action issued in Japanese Patent Application No. 2022-148731, dated Jun. 20, 2025 in 14 pages.

*Primary Examiner* — Steven B Gauthier
*Assistant Examiner* — Khatib A Rahman
(74) *Attorney, Agent, or Firm* — Knobbe, Martens, Olson & Bear, LLP

(57) ABSTRACT

A semiconductor device includes a semiconductor part, first to third and control electrodes. The first electrode is provided on a back surface of the semiconductor part; and the second electrode is provided on a front surface thereof. The third electrode is provided between the first and second electrodes. The third electrode extends into the semiconductor part from the front surface side thereof. The third electrode is electrically insulated from the semiconductor part via an insulating space between the semiconductor part and the third electrode. The control electrode includes first and second portions. The first portion is linked to the second portion and extends between the semiconductor part and the third electrode. The second portion is provided between the second electrode and the third electrode. The first portion faces the insulating space via the third electrode; and the second portion extends between the insulating space and the second electrode.

18 Claims, 11 Drawing Sheets

(51) Int. Cl.
*H10D 64/00* (2025.01)
*H10D 64/27* (2025.01)

(56) References Cited

U.S. PATENT DOCUMENTS 8,871,593 B1 10/2014 Siemieniec et al.
10,121,892 B2 11/2018 Nishiwaki
10,304,933 B1 5/2019 Woo et al.
10,361,276 B1 7/2019 Seok
10,840,368 B2 11/2020 Ohno et al.
11,094,816 B2 * 8/2021 Shimomura ....... H10D 84/0135
11,133,411 B2 9/2021 Nishiwaki
11,164,968 B2 * 11/2021 Shimomura ......... H10D 30/668
2010/0181641 A1 * 7/2010 Blank .................. H10D 30/665 257/E21.536
2013/0069150 A1 * 3/2013 Matsuoka ............ H10D 64/117 438/270
2019/0296147 A1 * 9/2019 Kawamura .......... H10D 62/111
2020/0091333 A1 3/2020 Shimomura
2021/0202736 A1 7/2021 Nishiguchi
2021/0391458 A1 * 12/2021 Kobayashi ........... H10D 30/668
2022/0085160 A1 3/2022 Nishiwaki
2022/0302307 A1 * 9/2022 Oasa ...................... H10D 30/63
2023/0090527 A1 * 3/2023 Kikuchi ............... H10D 64/117 257/288

FOREIGN PATENT DOCUMENTS

JP 6426642 B2 11/2018
JP 2020-047625 A 3/2020
JP 2020-136587 A 8/2020
JP 2021-034543 A 3/2021
JP 2021-106179 A 7/2021
JP 2022-022074 A 2/2022
WO 2013/001677 A1 1/2013

* cited by examiner

40BP
40
40B
40A
40
40B
40A
D
D
30
40BM
45
30
40BP
40BM
45
30
Y
Z
X

GT
GT
43
40A
IS
40A
43
43
40A
40A
43
IS
17
15
50
15
17
15
50
15
17
15
Y
Z
X

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2022-148731, filed on Sep. 20, 2022; the entire contents of which are incorporated herein by reference.

FIELD

Embodiments relate to a semiconductor device and a method for manufacturing the same.

BACKGROUND

It is desirable for a power control semiconductor device to reduce the parasitic capacitance between electrodes.

DETAILED DESCRIPTION

Figure 1:
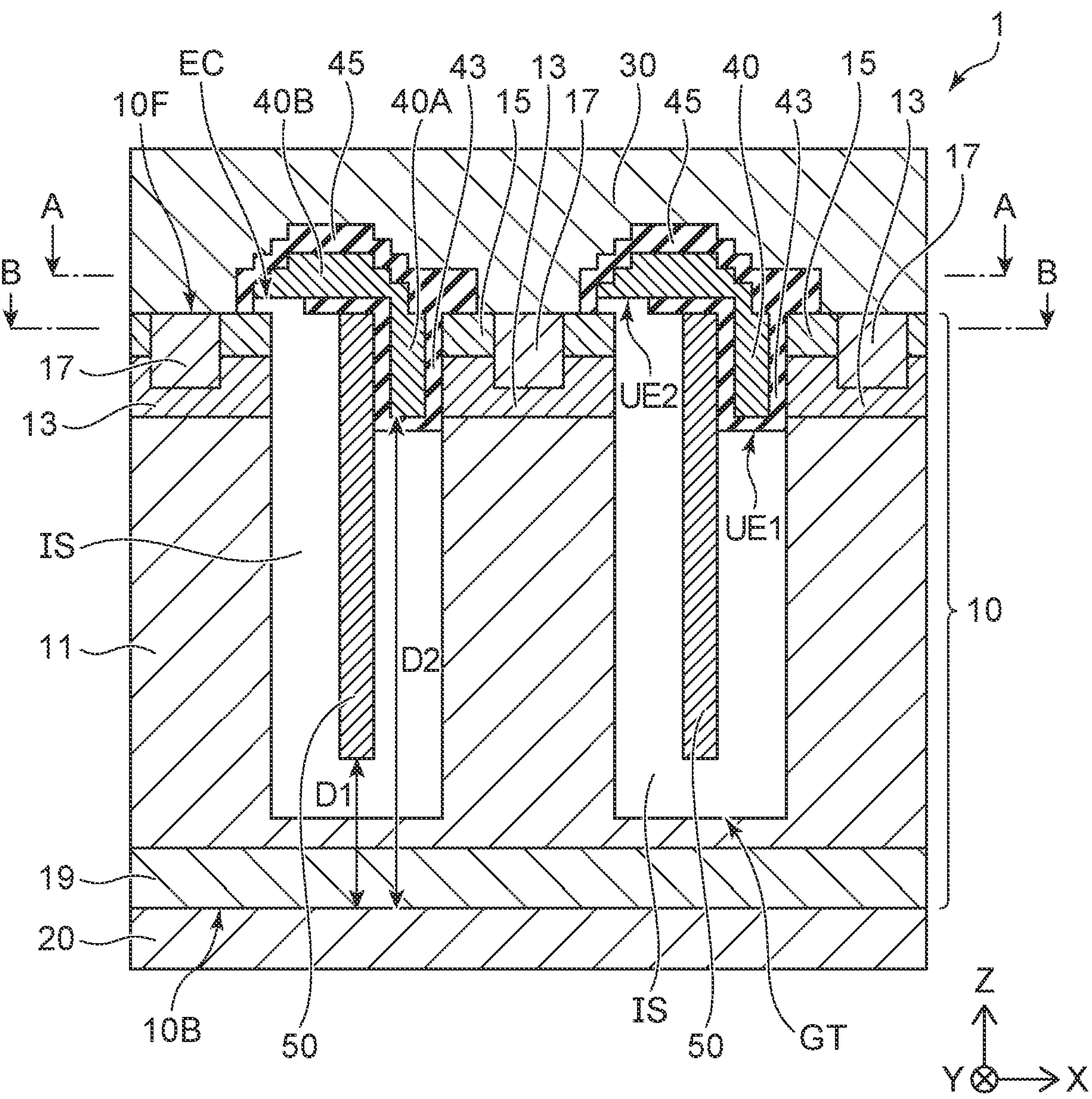
FIG. 1 is a schematic cross-sectional view showing a semiconductor device according to an embodiment.

According to one embodiment, a semiconductor device includes a semiconductor part, first to third electrodes and a control electrode. The first electrode is provided on a back surface of the semiconductor part; and the second electrode is provided on a front surface of the semiconductor part at a side opposite to the back surface. The third electrode is provided between the first electrode and the second electrode. The third electrode extends into the semiconductor part from the front surface side of the semiconductor part. The third electrode is electrically insulated from the semiconductor part via an insulating space between the semiconductor part and the third electrode. The control electrode includes a first portion and a second portion. The first portion is linked to the second portion at the front surface side of the semiconductor part and extends between the semiconductor part and the third electrode. The second portion is provided between the second electrode and the third electrode. The first portion faces the insulating space via the third electrode; and the second portion extends between the insulating space and the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a trench-gate MOS transistor. FIG. 1 illustrates the structure of the trench gate.

As shown in FIG. 1, the semiconductor device 1 includes a semiconductor part 10, a first electrode 20, a second electrode 30, a control electrode 40, and a third electrode 50.

The semiconductor part 10 is, for example, silicon. The semiconductor part 10 is positioned between the first electrode 20 and the second electrode 30. The first electrode 20 is, for example, a drain electrode. The second electrode 30 is, for example, a source electrode. The first electrode 20 is provided on a back surface 10B of the semiconductor part 10. The second electrode 30 is provided on a front surface 10F of the semiconductor part 10 at the side opposite to the back surface 10B. The semiconductor part 10 includes a gate trench GT provided at the front surface 10F side.

The control electrode 40 and the third electrode 50 are positioned between the first electrode 20 and the second electrode 30. The control electrode 40 is, for example, a gate electrode. The third electrode 50 is a so-called field plate electrode. The third electrode 50 is electrically connected to, for example, the second electrode 30 at a termination part (not illustrated).

The control electrode 40 includes a first portion 40A positioned inside the gate trench GT, and a second portion 40B positioned at the opening of the gate trench GT. The second portion 40B is linked to the first portion 40A.

The third electrode 50 extends in a direction from the first electrode 20 toward the second electrode 30 inside the gate trench GT. The second portion 40B of the control electrode 40 is positioned between the second electrode 30 and the third electrode 50. The first portion 40A of the control electrode 40 is positioned between the semiconductor part 10 and the third electrode 50. A first distance D1 from the first electrode 20 to the third electrode 50 is less than a second distance D2 from the first electrode 20 to the first portion 40A of the control electrode 40.

A first insulating film 43 is provided between the semiconductor part 10 and the first portion 40A of the control electrode 40. The first insulating film 43 is, for example, a gate insulating film and electrically insulates the control electrode 40 from the semiconductor part 10. The first insulating film 43 covers the lower end of the first portion 40A of the control electrode 40 and extends between the first portion 40A and the third electrode 50 and between the second portion 40B and the upper end of the third electrode 50. The first insulating film 43 electrically insulates the control electrode 40 from the third electrode 50. The first insulating film 43 is, for example, a silicon oxide film.

A second insulating film 45 is provided between the second electrode 30 and the control electrode 40. The second insulating film 45 electrically insulates the control electrode 40 from the second electrode 30. The second insulating film 45 is, for example, an inter-layer insulating film. The second insulating film 45 is, for example, a silicon oxide film.

The third electrode 50 faces the semiconductor part 10 via an insulating space IS inside the gate trench GT. The insulating space IS electrically insulates the third electrode 50 from the semiconductor part 10. The insulating space IS has, for example, a lower dielectric constant than the first insulating film 43. The insulating space IS is, for example, a cavity, i.e., a so-called air gap, inside the gate trench GT. The insulating space IS may be filled with an insulator that has a low dielectric constant, e.g., a low-k material.

The insulating space IS includes a first end UE1 facing the first portion 40A of the control electrode 40, and a second end UE2 facing the second portion 40B. The first end UE1 faces the first portion 40A of the control electrode 40 via the first insulating film 43. The second end UE2 faces the second portion 40B of the control electrode 40. The first insulating film 43 extends between the second portion 40B of the control electrode 40 and the second end UE2 of the insulating space IS.

In a lateral direction, for example, the X-direction, the first portion 40A of the control electrode 40 faces the insulating space IS via the third electrode 50. The upper end of the third electrode 50 is positioned between the first portion 40A of the control electrode 40 and the second end UE2 of the insulating space IS.

An opening EC that is linked to the insulating space IS is provided between the semiconductor part 10 and the second portion 40B of the control electrode 40. The insulating space IS is in communication with, for example, the second insulating film 45 via the opening EC. The second insulating film 45 plugs the opening EC. In other words, the opening EC is provided between the second portion 40B and the semiconductor part 10 so that the second insulating film 45 easily plugs the opening EC.

As shown in FIG. 1, the semiconductor part 10 includes a first semiconductor layer 11, a second semiconductor layer 13, a third semiconductor layer 15, a fourth semiconductor layer 17 and a fifth semiconductor layer 19. The first, third and fifth semiconductor layers 11, 15, 19 are first conductivity type layers. The second and fourth semiconductor layers 13, 17 are second conductivity type layers. Hereinafter, the first conductivity type is described as an n-type and the second conductivity type is described as a p-type, but the first conductivity type and the second conductivity type are not limited thereto.

The first semiconductor layer 11 is, for example, an n-type drift layer. The first semiconductor layer 11 extends between the first electrode 20 and the second electrode 30. The gate trench GT has a depth enough to reach the first semiconductor layer 11 from the front surface 10F side of the semiconductor part 10. The first semiconductor layer 11 faces the third electrode 50 via the insulating space IS.

The second semiconductor layer 13 is, for example, a p-type body layer. The second semiconductor layer 13 is provided between the first semiconductor layer 11 and the second electrode 30. The second semiconductor layer 13 faces the first portion 40A of the control electrode 40 via the first insulating film 43. The second semiconductor layer 13 also includes a portion facing an insulating space IS in another gate trench GT.

The third semiconductor layer 15 is, for example, an n-type source layer. The third semiconductor layer 15 is provided between the second semiconductor layer 13 and the second electrode 30. The third semiconductor layer 15 is partially provided on the second semiconductor layer 13. The third semiconductor layer 15 contacts the first insulating film 43, and faces the insulating space IS in the other gate trench GT. The opening EC that communicates with the insulating space IS is provided between the third semiconductor layer 15 and the second portion 40B of the control electrode 40 in the other gate trench GT. The third semiconductor layer 15 overlaps the end of the second portion 40B in the direction from the first electrode 20 toward the second electrode 30, e.g., a Z-direction.

The fourth semiconductor layer 17 is, for example, a p-type contact layer. The fourth semiconductor layer 17 is provided between the second semiconductor layer 13 and the second electrode 30. The fourth semiconductor layer 17 is partially provided on the second semiconductor layer 13 and positioned beside the third semiconductor layer 15. The fourth semiconductor layer 17 includes a second-conductivity-type impurity with a higher concentration than a concentration of the second-conductivity-type impurity in the second semiconductor layer 13. The fourth semiconductor layer 17 is provided between, for example, the third semiconductor layers 15 one of which faces the first insulating film 43 and the other of which faces the insulating space IS.

The second electrode 30 is in contact with the third and fourth semiconductor layers 15, 17 and electrically connected thereto. The second electrode 30 is electrically connected to the second semiconductor layer 13 via the fourth semiconductor layer 17.

The fifth semiconductor layer 19 is, for example, an n-type drain layer. The fifth semiconductor layer 19 is provided between the first semiconductor layer 11 and the first electrode 20. The fifth semiconductor layer 19 includes a first-conductivity-type impurity with a higher concentration than a concentration of the first-conductivity-type impurity in the first semiconductor layer. The first electrode 20 is in contact with the fifth semiconductor layer 19 and electrically connected thereto. The first electrode 20 is electrically connected to the first semiconductor layer 11 via the fifth semiconductor layer 19.

In the semiconductor device 1, the parasitic capacitance between the first electrode 20 and the third electrode 50, i.e., so called the source-drain capacitance can be reduced by providing the insulating space IS inside the gate trench GT. The parasitic capacitance between the control electrode 40 and the third electrode 50 and between the second electrode 30 and the control electrode 40, i.e., the so-called gate capacitance can be reduced by providing the control electrode 40 at one of the lateral sides of the third electrode 50. Moreover, the X-direction width of the gate trench GT can be reduced while maintaining the parasitic capacitance between the first electrode 20 and the third electrode 50 not to be more than a prescribed value. Thereby, it is possible to reduce the density of the gate trenches GT at the front surface 10F of the semiconductor part 10. Therefore, the gate width is substantially increased, and the on-resistance can be reduced.

Figure 2A:
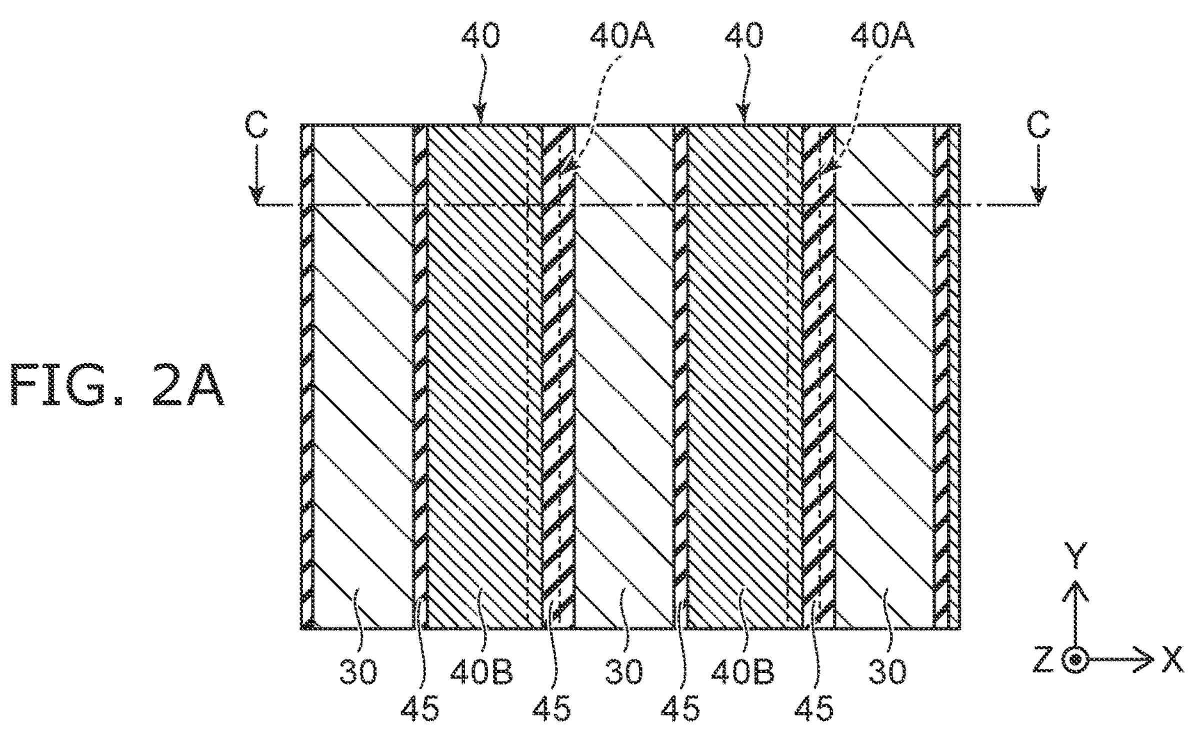
FIGS. 2A and 2B are schematic plan views showing the semiconductor device according to the embodiment.
Figure 2B:
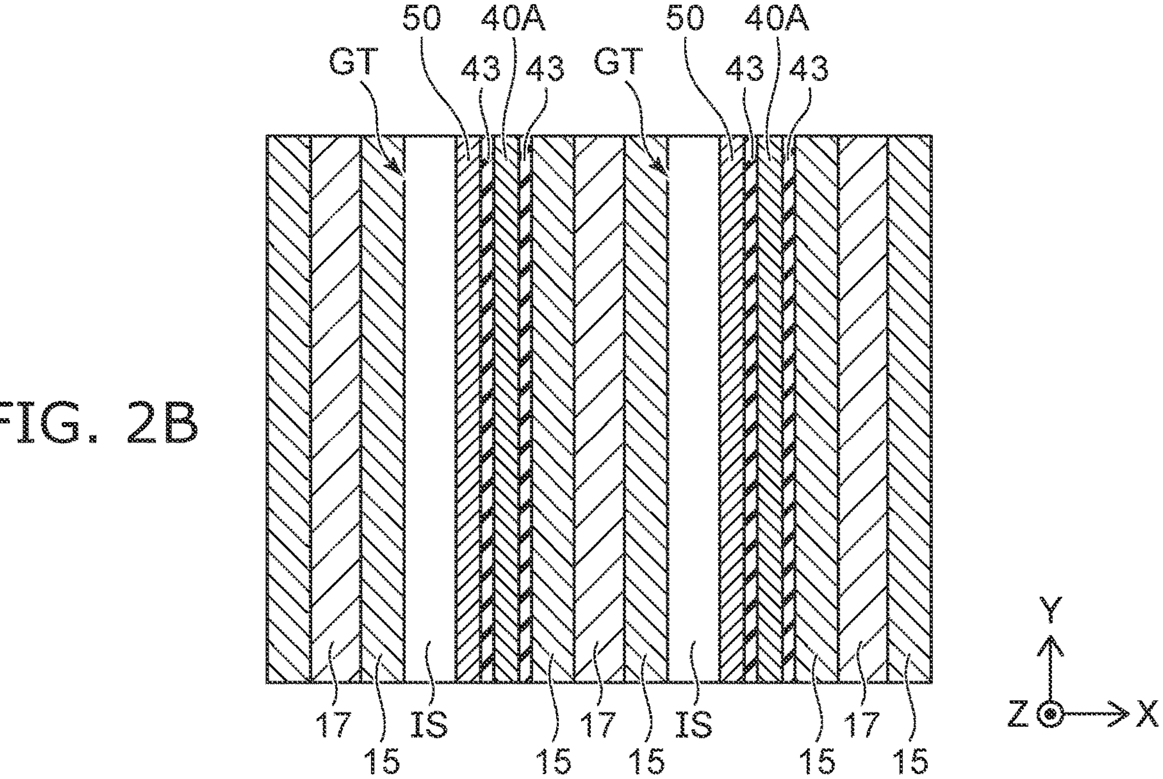

FIGS. 2A and 2B are schematic plan views showing the semiconductor device 1 according to the embodiment. FIG. 2A is a plan view illustrating a cross section denoted by A-A in FIG. 1. FIG. 2B is a plan view illustrating a cross section denoted by B-B in FIG. 1. It should be noted that FIG. 1 illustrates a cross section along line C-C shown in FIG. 2A.

As shown in FIG. 2A, the multiple control electrodes 40 are arranged in the X-direction. The second portion 40B of the control electrode 40 extends in the Y-direction with, for example, a uniform width in the X-direction. In FIG. 2A, the first portion 40A of the control electrode 40 is shown by broken lines. The first portion 40A of the control electrode 40 also extends in the Y-direction.

As shown in FIG. 2B, the gate trench GT between the adjacent third semiconductor layers 15 extends in the Y-direction; and the insulating space IS also extends in the Y-direction. The third electrode 50 is positioned between the insulating space IS and the first portion 40A of the control electrode 40.

Figures 3A, 3B:
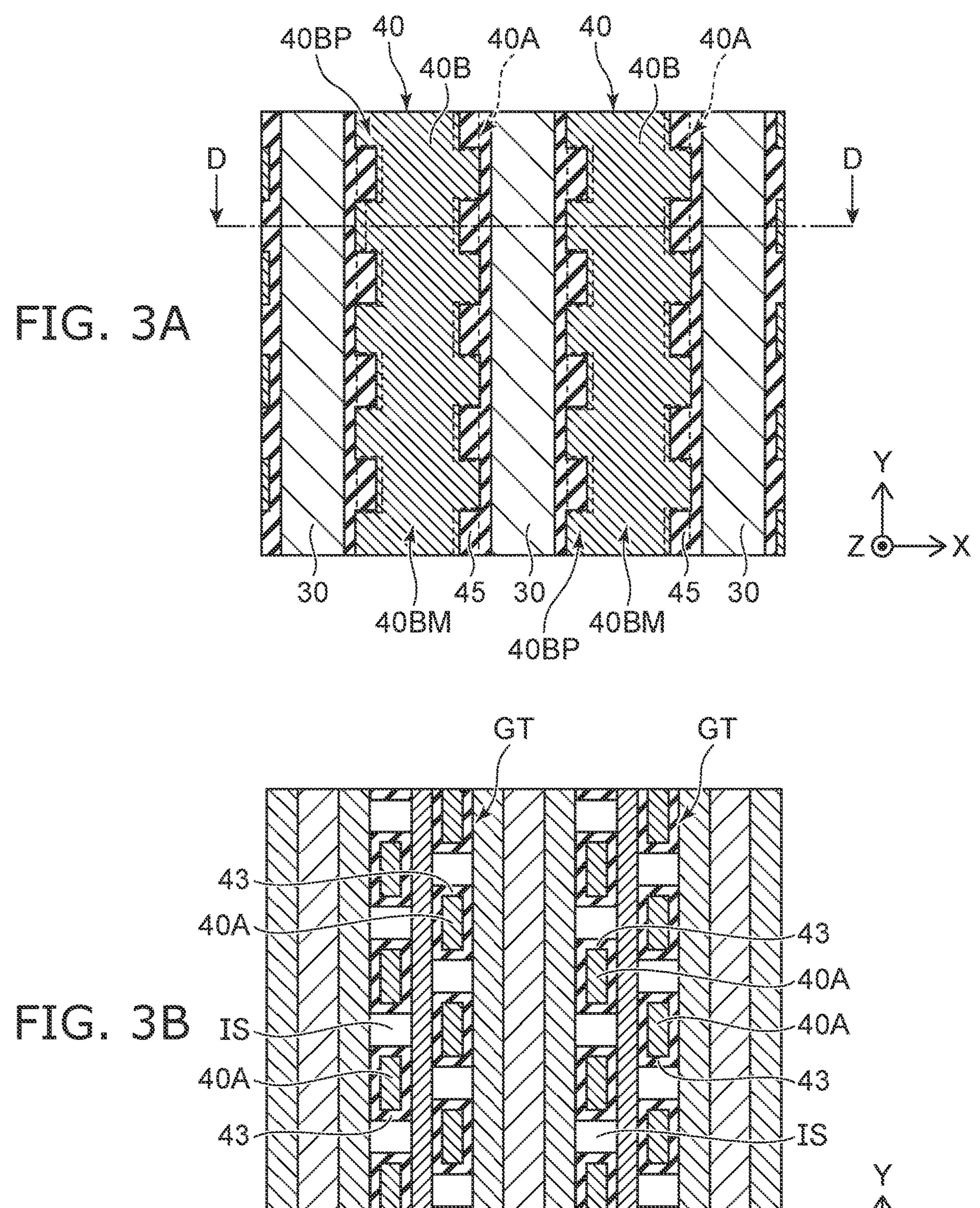
FIGS. 3A and 3B are schematic plan views showing the semiconductor device according to a modification of the embodiment.

FIGS. 3A and 3B are schematic plan views showing the semiconductor device 1 according to a modification of the embodiment. FIG. 3A is a plan view illustrating the cross section denoted by A-A in FIG. 1. FIG. 3B is a plan view illustrating the cross section denoted by B-B in FIG. 1. It should be noted that FIG. 1 illustrates a cross section along line D-D shown in FIG. 3A.

As shown in FIGS. 3A and 3B, the control electrode 40 includes multiple first portions 40A. The multiple first portions 40A are arranged in the extension direction of the gate trench GT, e.g., the Y-direction and apart from each other.

As shown in FIG. 3A, the second portion 40B of the control electrode 40 includes a major portion 40BM extending in the Y-direction, and multiple extension portions 40BP protruding in the X-direction and the opposite direction. The major portion 40BM is provided on the third electrode 50. The first portions 40A of the control electrode 40 each are provided beneath the second insulating film 45 between the extension portions 40BP next to each other in the Y-direction.

As shown in FIG. 3B, the first portions 40A of the control electrode 40 are arranged at two sides of the third electrode 50. The insulating space IS is provided between the first portions 40A next to each other in the Y-direction. The multiple first portions 40A face the insulating space IS via the third electrode 50 in the X-direction or the opposite direction. The extension portion 40BP of the second portion 40B (see FIG. 3A) covers the insulating space IS between the first portions 40A next to each other in the Y-direction.

Figure 4A:
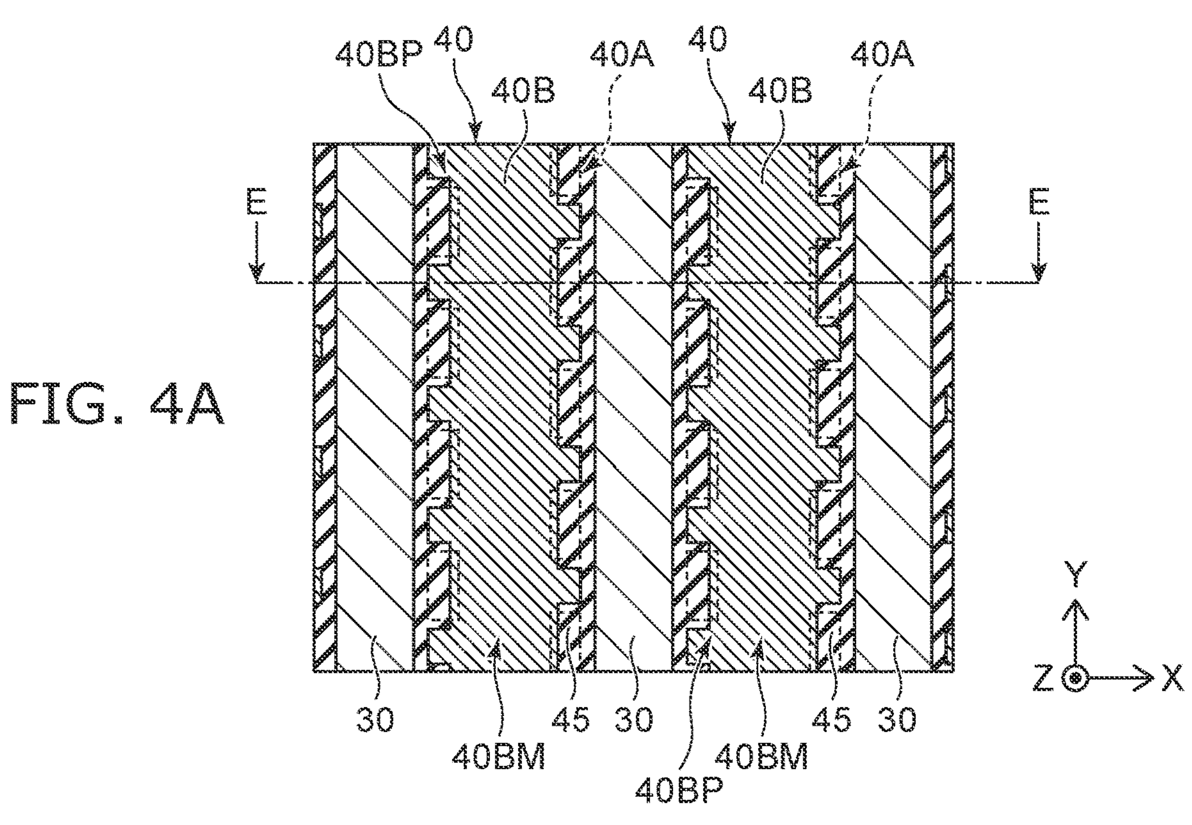
FIGS. 4A and 4B are schematic plan views showing the semiconductor device according to another modification of the embodiment.
Figure 4B:
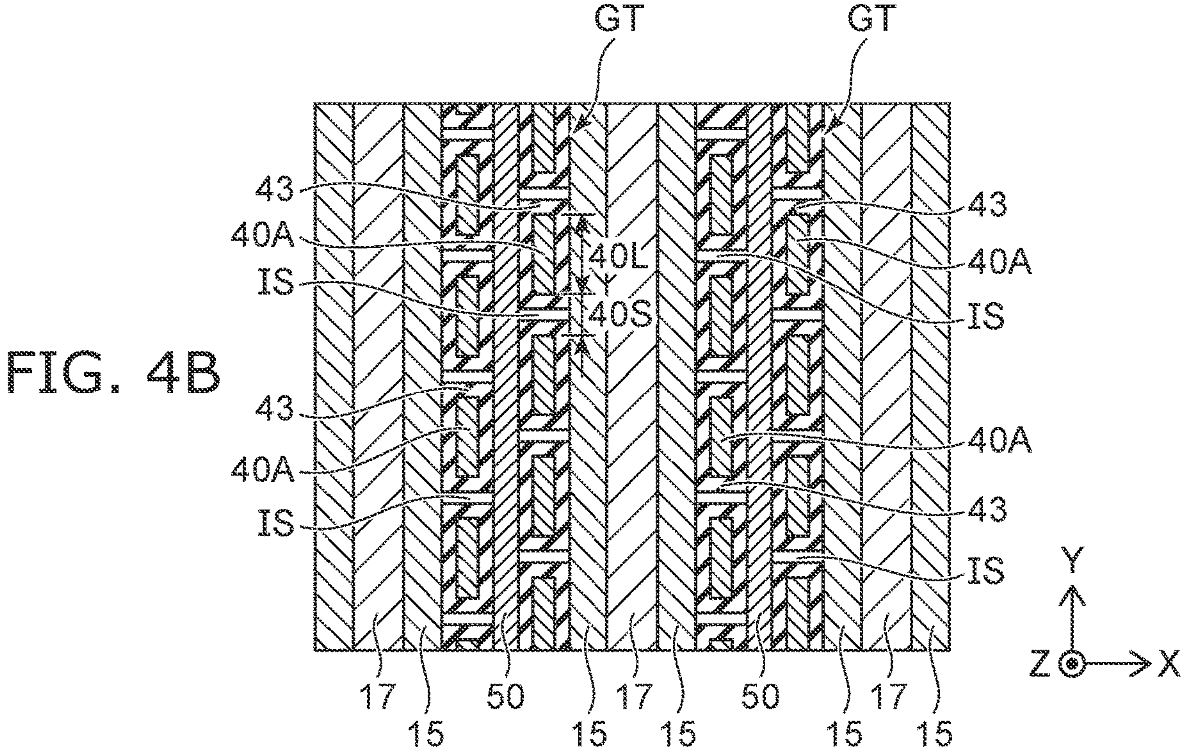

FIGS. 4A and 4B are schematic plan views showing the semiconductor device 1 according to another modification of the embodiment. FIG. 4A is a plan view illustrating the cross section denoted by A-A in FIG. 1. FIG. 4B is a plan view illustrating the cross section denoted by B-B in FIG. 1. It should be noted that FIG. 1 illustrates a cross section along line E-E shown in FIG. 4A.

In the example, the control electrode 40 also includes the multiple first portions 40A. The multiple first portions 40A are arranged in the extension direction of the gate trench GT, e.g., the Y-direction and apart from each other.

As shown in FIG. 4A, the second portion 40B of the control electrode 40 also includes the major portion 40BM extending in the Y-direction, and the multiple extension portions 40BP protruding in the X-direction and the opposite direction. The major portion 40BM is provided on the third electrode 50. As shown in FIG. 4B, the first portion 40A of the control electrode 40 is arranged at two sides of the third electrode 50. The insulating space IS is provided between the first portions 40A next to each other in the Y-direction. The insulating space IS faces the first portion 40A via the third electrode 50 in the X-direction or the opposite direction. The extension portion 40BP of the second portion 40B (see FIG. 4A) covers the insulating space IS between the first portions 40A next to each other in the Y-direction.

In the example, the first portion 40A of the control electrode 40 has a length 40L in the Y-direction that is longer than a spacing 40S of the first portions 40A next to each other in the Y-direction. The width of the gate channel can be increased thereby.

A method for manufacturing the semiconductor device 1 will now be described with reference to FIGS. 5A to 10B. FIGS. 5A to 10B are schematic cross-sectional views showing manufacturing processes of the semiconductor device 1 according to the embodiment.

Figure 5A:
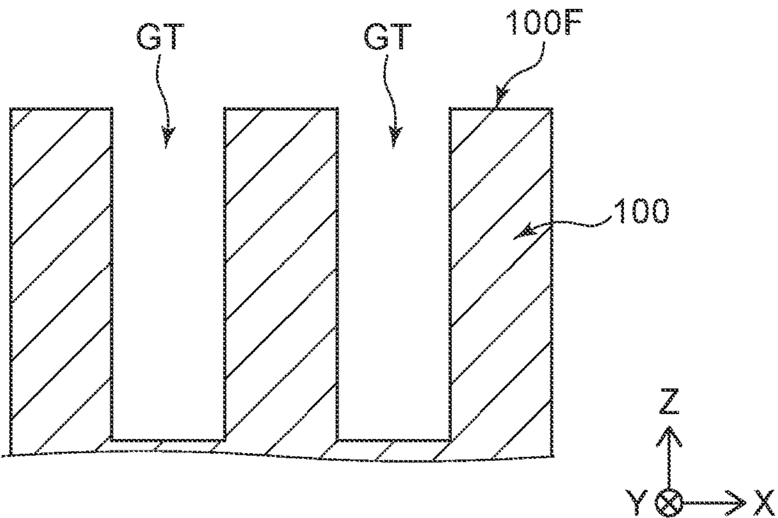
FIGS. 5A to 10B are schematic cross-sectional views showing manufacturing processes of the semiconductor device according to the embodiment.

As shown in FIG. 5A, the gate trench GT is formed in a front surface 100F side of a semiconductor wafer 100. The semiconductor wafer 100 is, for example, an n-type silicon wafer. The semiconductor wafer 100 includes, for example, a second-conductivity-type impurity with the same concentration as the concentration of the first-conductivity-type impurity in the first semiconductor layer 11. The gate trench GT is formed by, for example, selectively etching the semiconductor wafer 100 by anisotropic RIE (Reactive Ion Etching) using a not-illustrated etching mask.

Figure 5B:
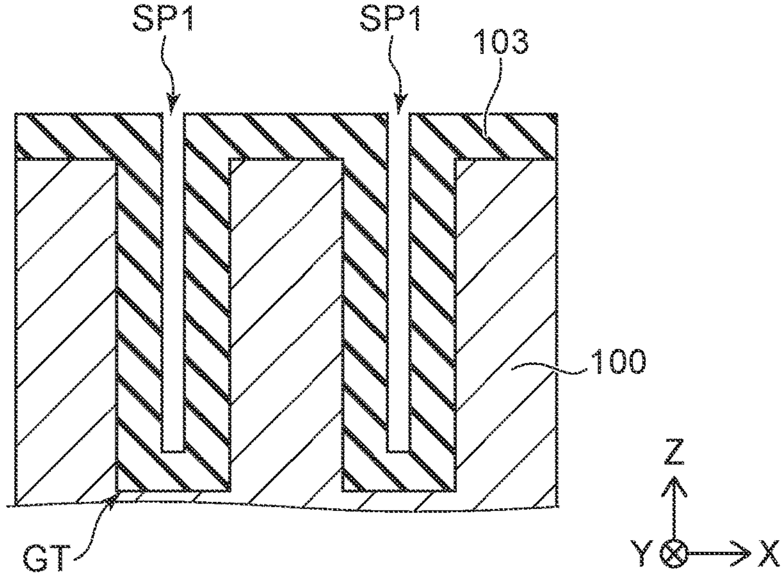

As shown in FIG. 5B, a sacrificial film 103 is formed at the front surface 100F side of the semiconductor wafer 100. The sacrificial film 103 covers the inner surface of the gate trench GT so that a first space SP1 remains inside the gate trench GT. The sacrificial film 103 also covers the front surface 100F of the semiconductor wafer 100. The sacrificial film 103 is, for example, a silicon nitride film. The sacrificial film 103 is formed using, for example, CVD (Chemical Vapor Deposition).

Figure 5C:
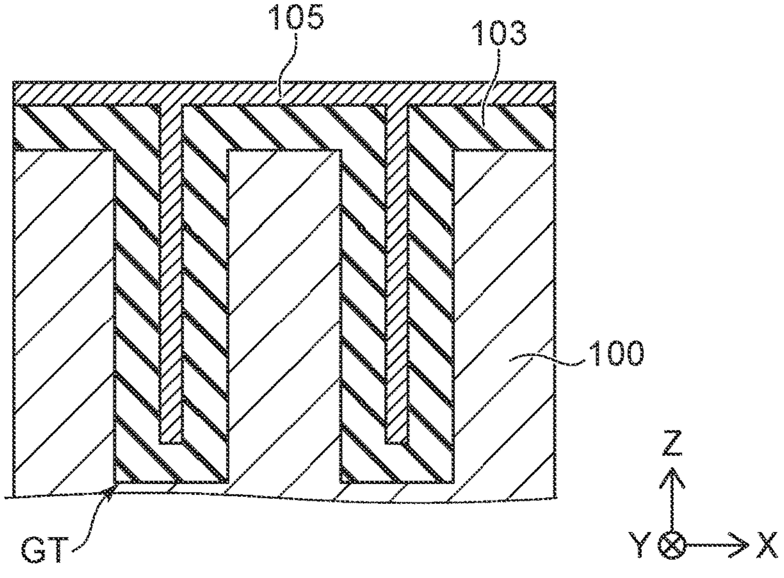

As shown in FIG. 5C, a conductive film 105 is formed at the front surface 100F side of the semiconductor wafer 100. The first space SP1 inside the gate trench GT is filled with the conductive film 105. The conductive film 105 is, for example, conductive polysilicon. The conductive film 105 is formed on the sacrificial film 103 by using, for example, CVD.

Figure 6A:
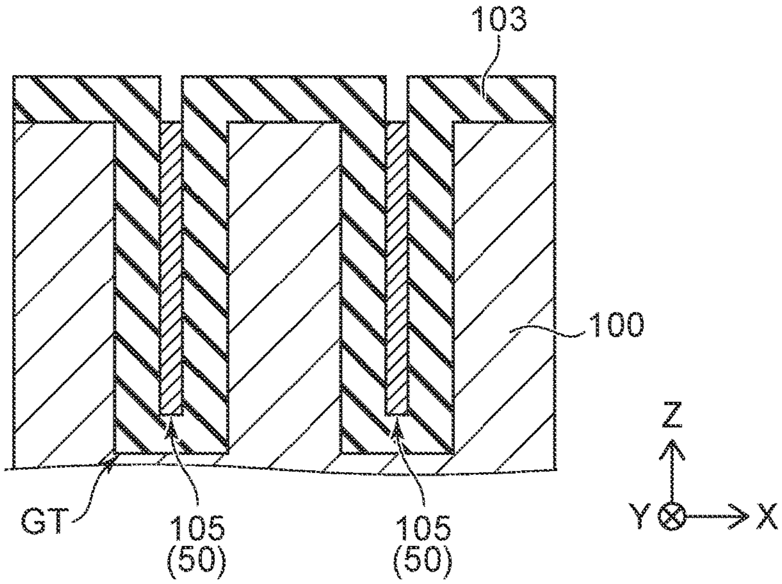

As shown in FIG. 6A, the conductive film 105 is removed so that the portion thereof remains inside the gate trench GT. The conductive film 105 is removed using, for example, isotropic dry etching. The portion of the conductive film 105 that remains inside the gate trench GT becomes the third electrode 50.

Figure 6B:
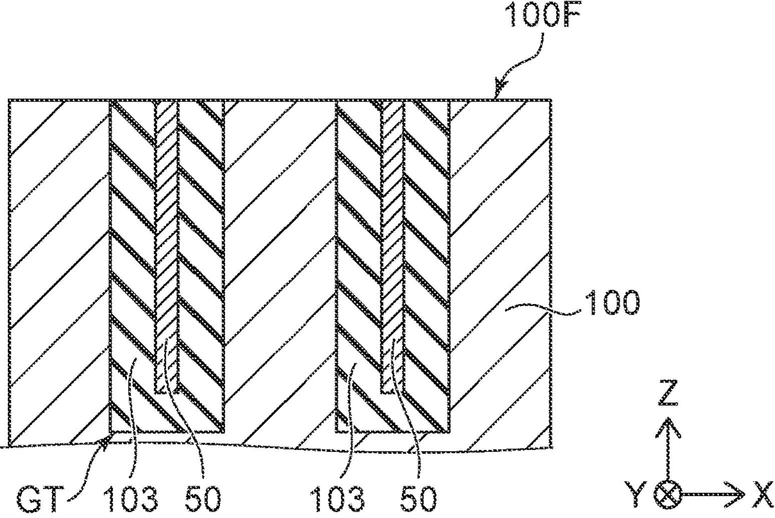

As shown in FIG. 6B, the sacrificial film 103 formed on the front surface 100F of the semiconductor wafer 100 is removed so that the portion of the sacrificial film 103 remains inside the gate trench GT. The sacrificial film 103 is removed using, for example, CMP (Chemical Mechanical Polishing).

Figure 6C:
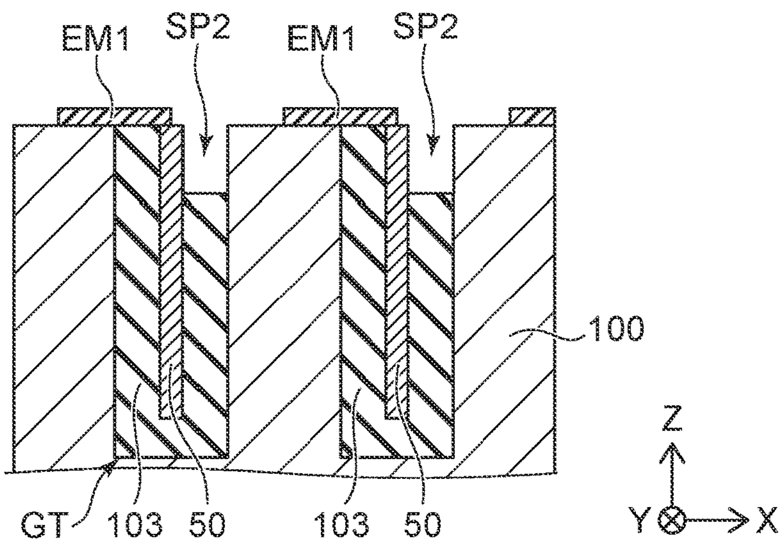

As shown in FIG. 6C, the sacrificial film 103 is partially removed inside the gate trench GT. The sacrificial film 103 is selectively removed using, for example, an etching mask EM1. Thereby, a second space SP2 is formed at the opening side of the gate trench GT. The second space SP2 is provided at one side of the upper end of the third electrode 50. The second space SP2 faces, via the third electrode 50, the upper end of the sacrificial film 103 protected by the etching mask EM1. The etching mask EM1 is, for example, a photoresist.

Figure 7A:
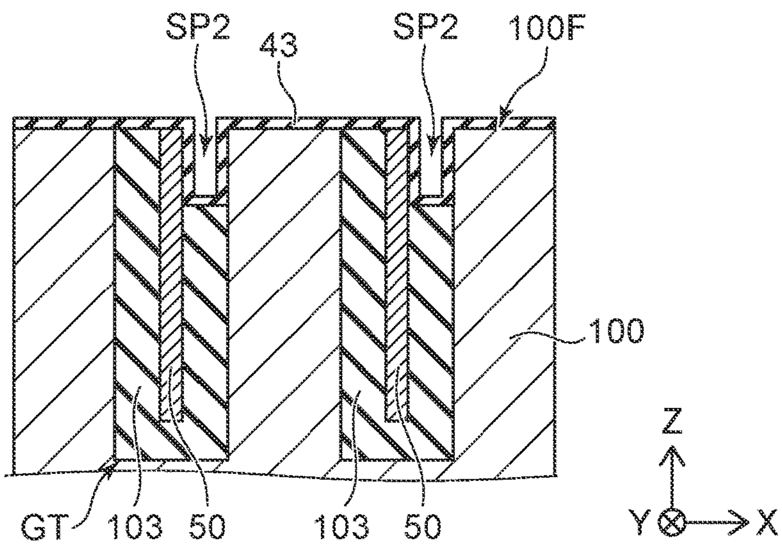

As shown in FIG. 7A, the first insulating film 43 is formed at the front surface 100F side of the semiconductor wafer 100. The first insulating film 43 covers the inner surface of the second space SP2 inside the gate trench GT so that the second space SP2 remains. The first insulating film 43 is formed using, for example, CVD. The first insulating film 43 may have a two-layer structure including an initial film formed by thermal oxidation of the exposed surface of the semiconductor wafer 100, and the CVD film deposited on the initial film.

Figure 7B:
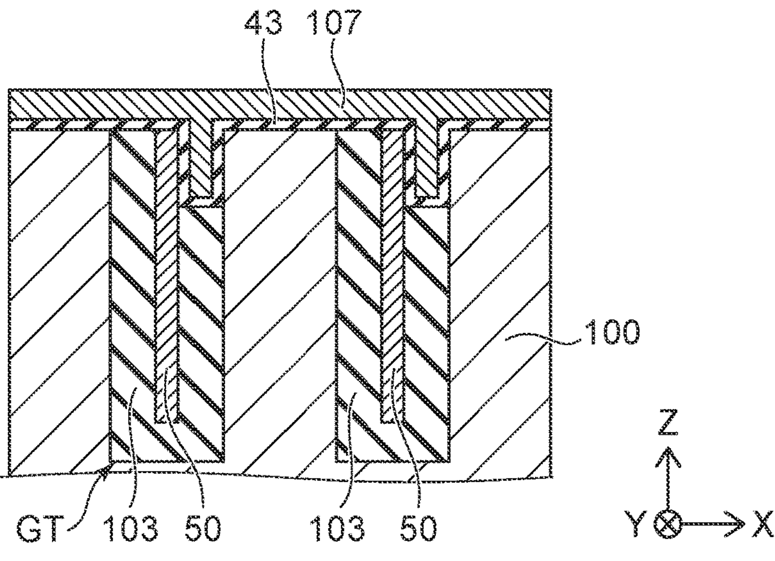

As shown in FIG. 7B, a conductive film 107 is formed on the first insulating film 43. The conductive film 107 is, for example, conductive polysilicon. The conductive film 107 is formed using, for example, CVD; and the second space SP2 is filled with the conductive film 107.

Figure 7C:
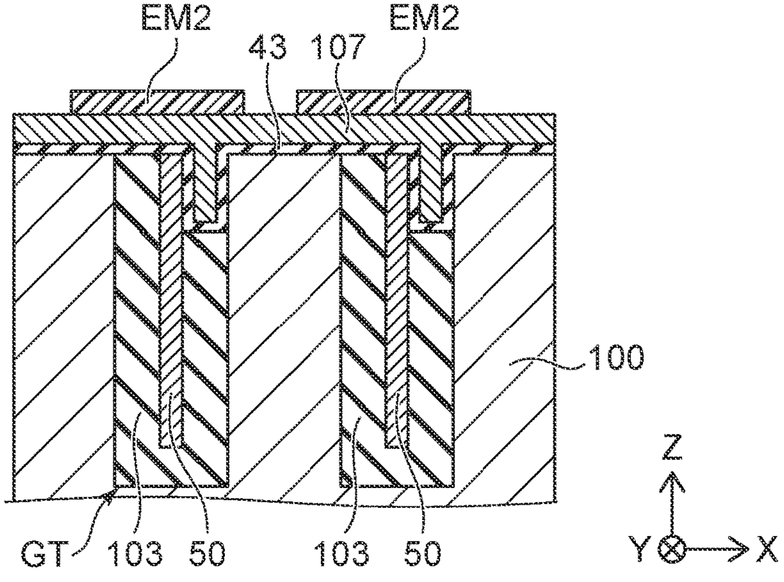

As shown in FIG. 7C, an etching mask EM2 is formed on the conductive film 107. The etching mask EM2 has the same planar shape as the planar shape of the second portion 40B of the control electrode 40 (see FIG. 2A, FIG. 3A, and FIG. 4A). The etching mask EM2 is, for example, a photoresist.

Figure 8A:
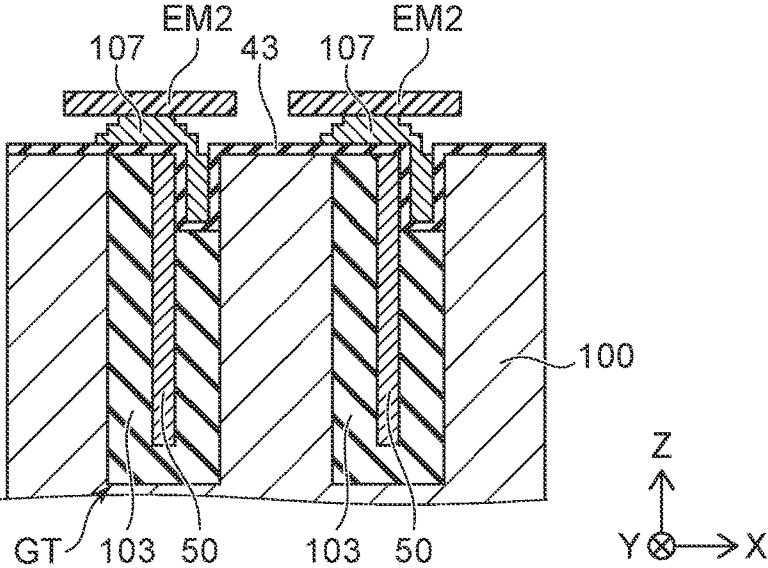

As shown in FIG. 8A, the conductive film 107 is selectively removed using the etching mask EM2. The conductive film 107 is removed using, for example, isotropic dry etching or wet etching. The conductive film 107 that remains at the opening side of the gate trench GT becomes the control electrode 40. One end of the conductive film 107 is positioned inside the gate trench GT, and the other end is preferably positioned above the front surface 100F of the semiconductor wafer 100.

Figure 8B:
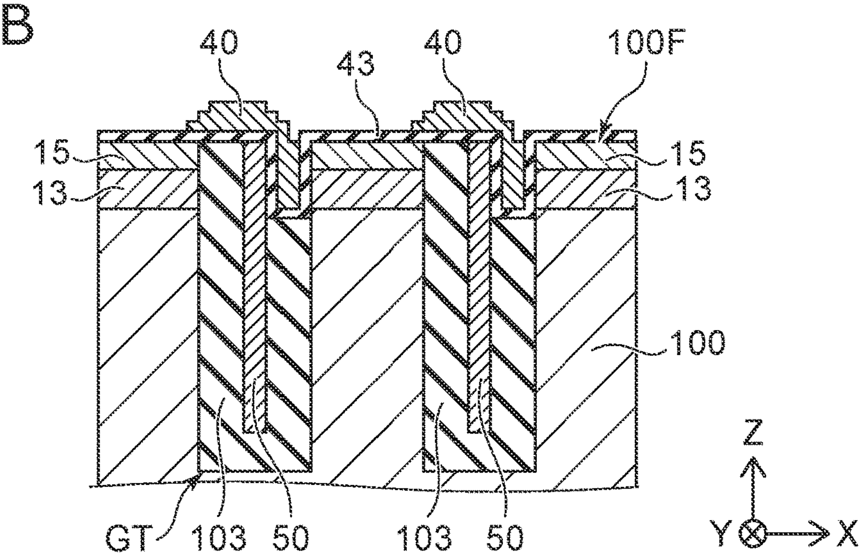

As shown in FIG. 8B, the second semiconductor layer 13 and the third semiconductor layer 15 are formed in this order after removing the etching mask EM2. The second semiconductor layer 13 is formed by ion-implanting a second-conductivity-type impurity, e.g., boron (B), into the front surface 100F side of the semiconductor wafer 100. The ion-implanted second-conductivity-type impurity is activated by heat treatment and diffused to a prescribed depth during the heat treatment. The third semiconductor layer 15 is formed by ion-implanting a first-conductivity-type impurity, e.g., phosphorus (P) or arsenic (As), into the front surface 100F side of the semiconductor wafer 100. The ion-implanted first-conductivity-type impurity is activated by next heat treatment.

Figure 8C:
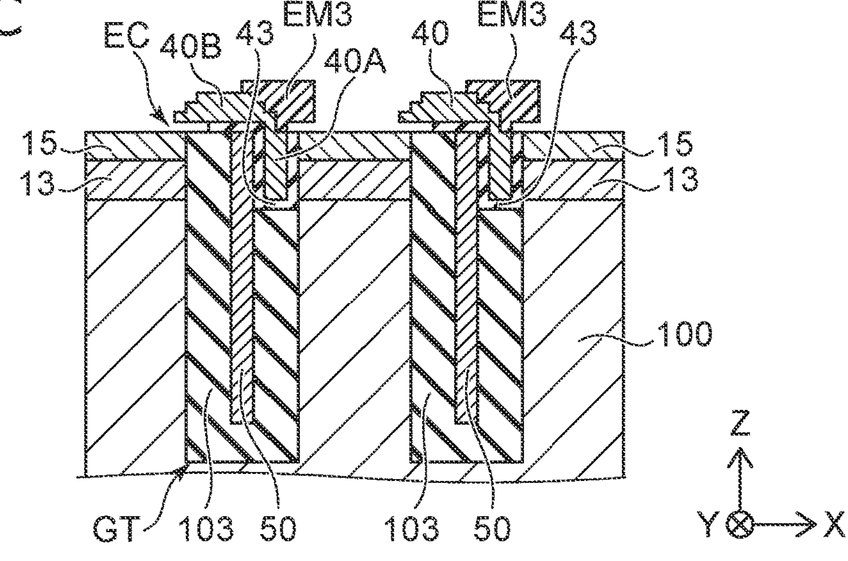

As shown in FIG. 8C, the first insulating film 43 is selectively removed using an etching mask EM3. The etching mask EM3 covers the first portion 40A of the control electrode 40. The etching mask EM3 is, for example, a photoresist.

The first insulating film 43 is removed using, for example, wet etching. The first insulating film 43 also is partially removed under the etching mask EM3 and the second portion 40B of the control electrode 40 by side etching. Thereby, the opening EC is formed between the third semiconductor layer 15 and the second portion 40B of the control electrode 40. The opening EC communicates with the sacrificial film 103, and the opening width in the Z-direction of the opening EC is equal to the film thickness in the Z-direction of the first insulating film 43. The opening width of the opening EC is, for example, 50 to 100 nm.

Figure 9A:
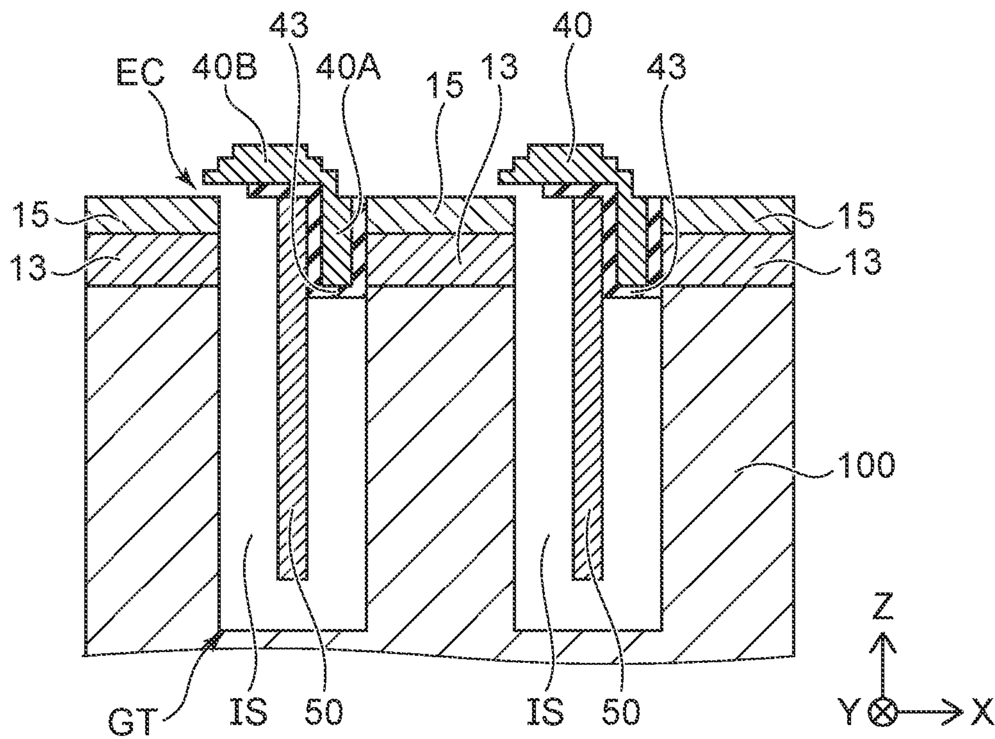

As shown in FIG. 9A, the insulating space IS is formed inside the gate trench GT by removing the sacrificial film 103. The sacrificial film 103 is removed by an etchant or an etching gas supplied via the opening EC. A cavity is formed thereby as the insulating space IS inside the gate trench GT. The third electrode 50 inside the gate trench GT is supported by the control electrode 40 via the first insulating film 43.

Figure 9B:
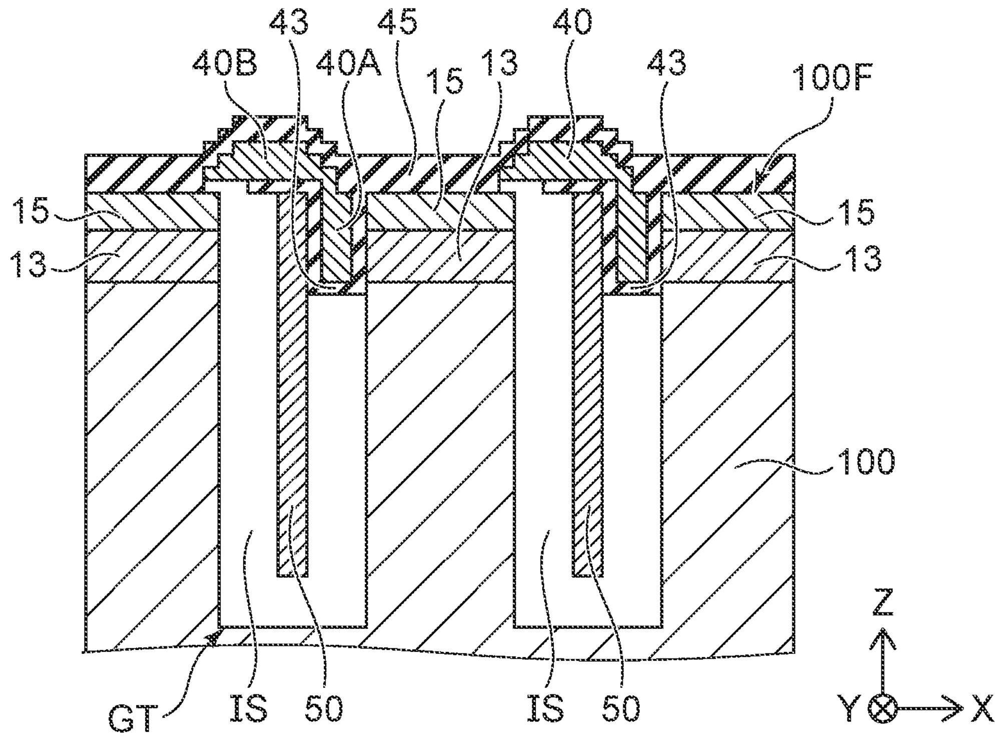

As shown in FIG. 9B, the second insulating film 45 is formed at the front side of the semiconductor wafer 100. The second insulating film 45 is, for example, formed using CVD. The second insulating film 45 is, for example, a silicon oxide film.

In the example, the opening width of the opening EC communicating with the insulating space IS is equal to the film thickness of the first insulating film 43, and the opening EC can be easily plugged by the second insulating film 45. In other words, the insulating space IS is easily sealed by the second insulating film 45.

Figure 10A:
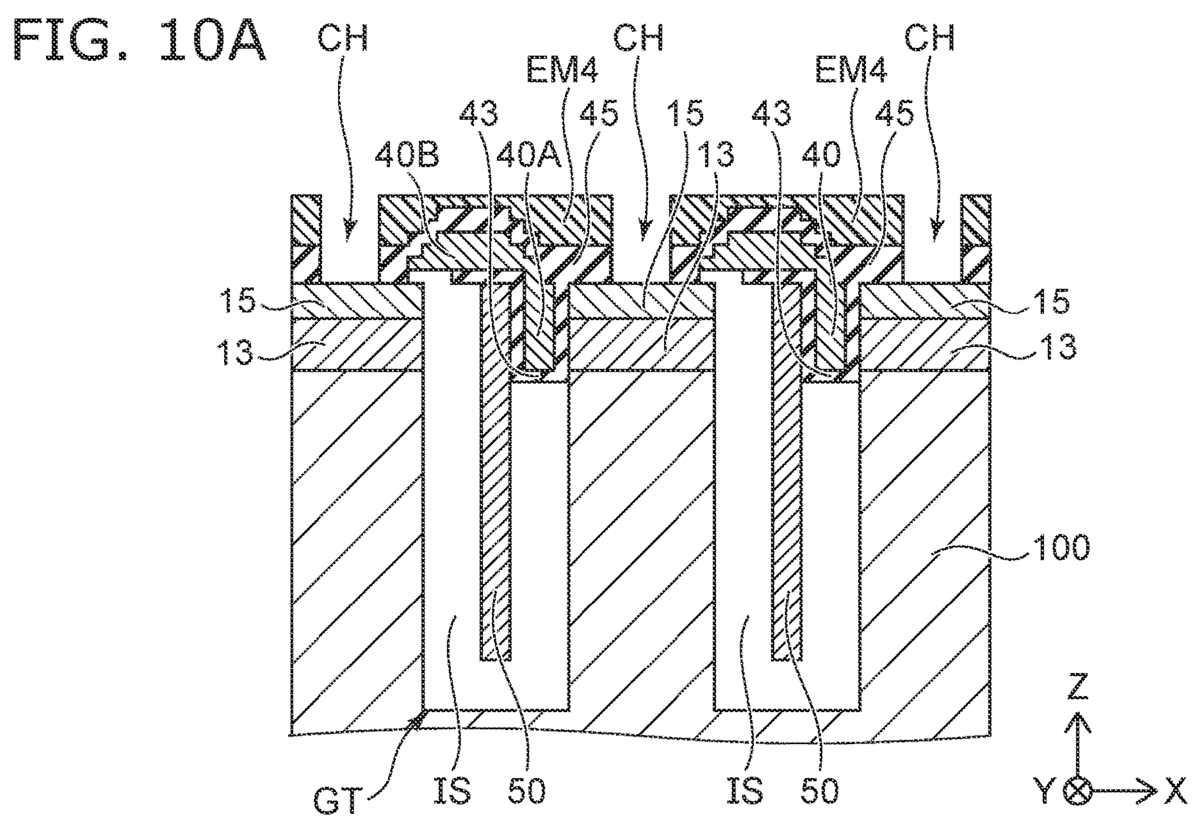

As shown in FIG. 10A, a contact hole CH is formed by selectively removing the second insulating film 45 using an etching mask EM4. The contact hole CH communicates with the third semiconductor layer 15. In other words, the third semiconductor layer 15 is exposed at the bottom surface of the contact hole CH.

Figure 10B:
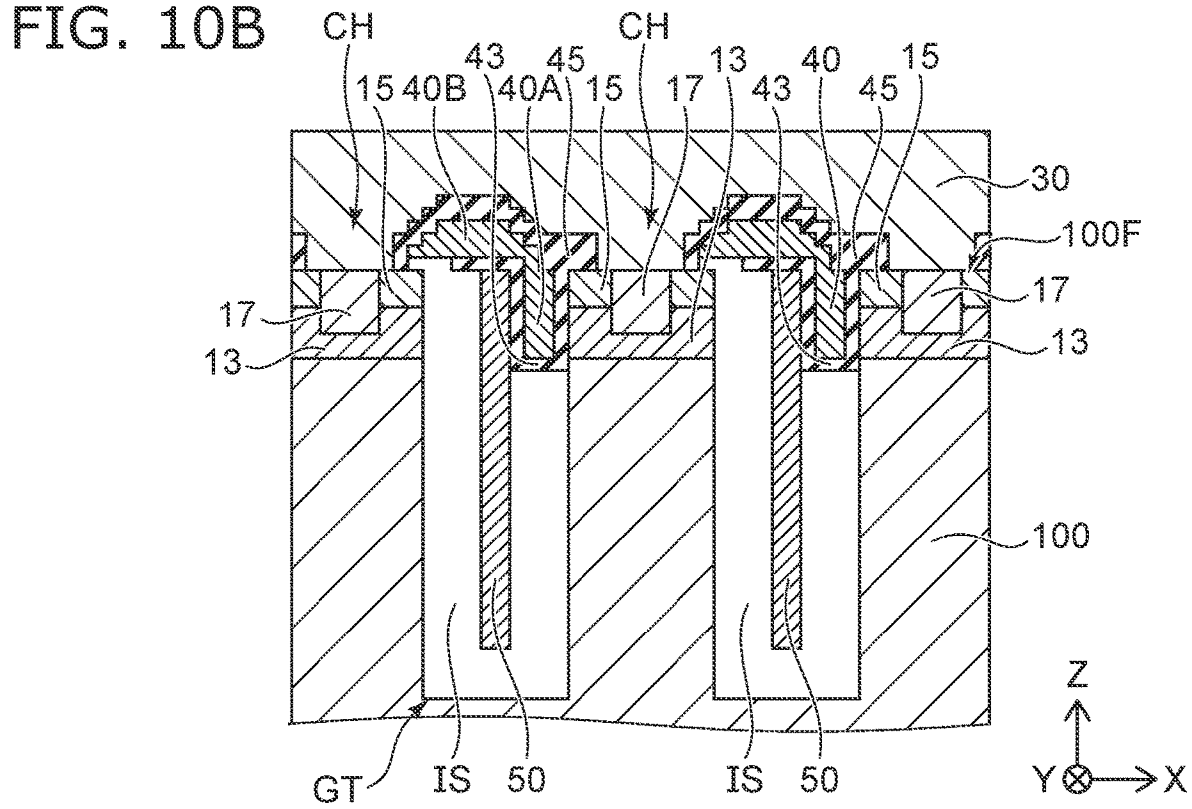

As shown in FIG. 10B, the fourth semiconductor layer 17 is formed by ion-implanting a second-conductivity-type impurity, e.g., boron (B), into the front surface 100F side of the semiconductor wafer 100 via the contact hole CH (see FIG. 10A). At this time, the second-conductivity-type impurity is implanted with a dose sufficient to partially invert the third semiconductor layer 15 to the second conductivity type.

After forming the fourth semiconductor layer 17 by performing heat treatment to activate the ion-implanted second-conductivity-type impurity, the third semiconductor layer 15 is exposed by enlarging the X-direction width of the contact hole by etching the second insulating film 45.

Then, the second electrode 30 is formed at the front surface 100F side of the semiconductor wafer 100. The second electrode 30 is, for example, a metal film formed using sputtering. The second electrode 30 covers the control electrode 40 via the second insulating film 45. The second electrode 30 is in contact with the third and fourth semiconductor layers 15 and 17 and electrically connected thereto at the bottom surface of the contact hole CH.

The first electrode 20 (see FIG. 1) is formed after thinning the semiconductor wafer 100 to a prescribed thickness by, for example, etching or polishing the backside (not illustrated) of the semiconductor wafer 100. At this time, the fifth semiconductor layer 19 is formed by, for example, ion-implanting a first-conductivity-type impurity into the backside. Alternatively, an epitaxial wafer may be used as the semiconductor wafer 100. The epitaxial layer includes the first semiconductor layer 11 epitaxially grown on a silicon substrate including a first-conductivity-type impurity with a high concentration; and the first semiconductor layer 11 including a first-conductivity-type impurity with a low concentration.

According to the manufacturing method described above, a low-dielectric-constant film (Low-k) may be used instead of the sacrificial film 103. In such a case, the low-dielectric-constant film is not removed, and remains inside the gate trench GT. In such a case, the insulating space IS is filled with the a low-dielectric-constant film.

Figure 11:
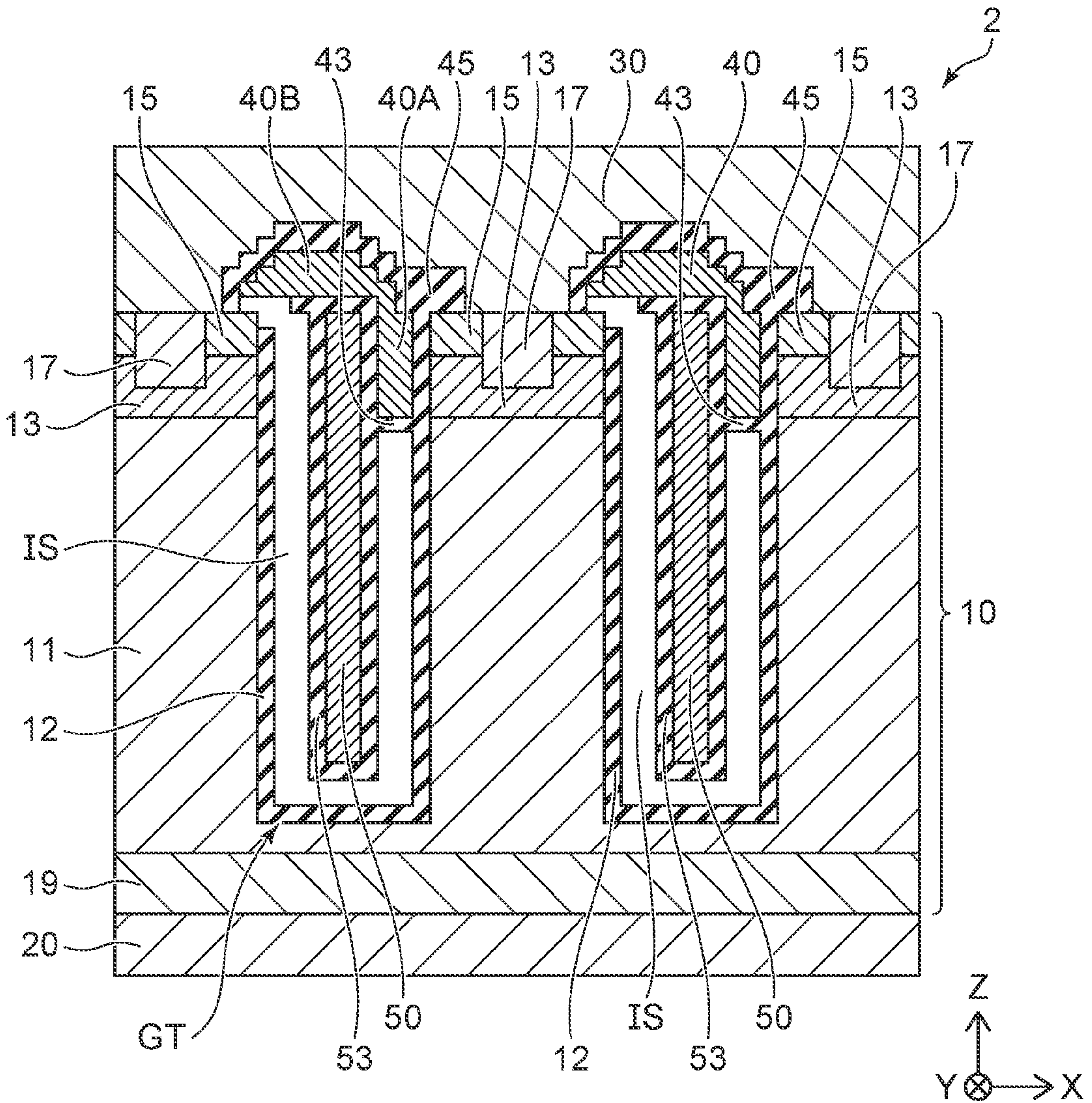
FIG. 11 is a schematic cross-sectional view showing a semiconductor device according to another modification of the embodiment.

FIG. 11 is a schematic cross-sectional view showing a semiconductor device 2 according to another modification of the embodiment. FIG. 11 illustrates a cross section corresponding to the cross section shown in FIG. 1.

In the example, as shown in FIG. 11, the insulating space IS also is provided inside the gate trench GT. The first portion 40A of the control electrode 40 and the third electrode 50 also are provided inside the gate trench GT. The second portion 40B of the control electrode 40 is provided at the opening of the gate trench GT and is positioned between the second electrode 30 and the third electrode 50.

The semiconductor device 2 further includes a third insulating film 12 and a fourth insulating film 53. The third insulating film 12 covers the inner surface of the gate trench GT. The fourth insulating film 53 covers the third electrode 50. The insulating space IS is provided between the third insulating film 12 and the fourth insulating film 53.

The third insulating film 12 and the fourth insulating film 53 are formed by, for example, thermal oxidation of the third electrode 50 and the inner surface of the gate trench GT before plugging the insulating space IS with the second insulating film 45. The third insulating film 12 and the fourth insulating film 53 are, for example, silicon oxide films. The third insulating film 12 may be formed by thermal oxidation of the semiconductor wafer 100 after forming the gate trench GT and before forming the sacrificial film 103 (see FIG. 5B).

By forming the third insulating film 12, the surface level can be stabilized at the inner surface of the gate trench GT. By forming the fourth insulating film 53, it is possible to reduce, for example, the impurity desorption from the third electrode 50 including the conductive polysilicon. The characteristics of the semiconductor device 2 can be stabilized thereby, and the reliability of the semiconductor device 2 can be increased.

According to the embodiments, the semiconductor device includes the following aspects:

Note 1: A semiconductor device, comprising:

a semiconductor part;

a first electrode provided on a back surface of the semiconductor part;

a second electrode provided on a front surface of the semiconductor part at a side opposite to the back surface;

a third electrode provided between the first electrode and the second electrode, the third electrode extending into the semiconductor part from the front surface side of the semiconductor part, the third electrode being electrically insulated from the semiconductor part via an insulating space between the semiconductor part and the third electrode; and a control electrode including a first portion and a second portion, the first portion being linked to the second portion at the front surface side of the semiconductor part and extending between the semiconductor part and the third electrode, the second portion being provided between the second electrode and the third electrode, the first portion facing the insulating space via the third electrode, the second portion extending between the insulating space and the second electrode.

Note 2: The device according to note 1, wherein a first distance from the first electrode to the third electrode is less than a second distance from the first electrode to the control electrode.

Note 3: The device according to note 1 or 2, wherein the control electrode includes a plurality of the first portions apart from each other.

Note 4: The device according to any one of notes 1 to 3, further comprising:

a first insulating film provided between the semiconductor part and the control electrode, the first insulating film electrically insulating the control electrode from the semiconductor part, a dielectric constant of the insulating space being less than a dielectric constant of the first insulating film.

Note 5: The device according to note 4, wherein the semiconductor part includes a first semiconductor layer of a first conductivity type, a second semiconductor layer of a second conductivity type, and a third semiconductor layer of the first conductivity type;

the first semiconductor layer extends between the first electrode and the second electrode, the third electrode extending inside the first semiconductor layer and facing the first semiconductor layer via the insulating space;

the second semiconductor layer is provided between the first semiconductor layer and the second electrode and faces the first portion of the control electrode via the first insulating film; and the third semiconductor layer is provided between the second semiconductor layer and the second electrode and is in contact with the first insulating film.

Note 6: The device according to note 5, wherein the second semiconductor layer facing the insulating space.

Note 7: The device according to any one of notes 4 to 6, wherein the first insulating film extends between the control electrode and the third electrode and electrically insulates the control electrode from the third electrode.

Note 8: The device according to any one of notes 1 to 7, further comprising a second insulating film provided between the second electrode and the control electrode, the second insulating film electrically insulating the control electrode from the second electrode.

Note 9: The device according to note 8, wherein the insulating space has an end positioned between the semiconductor part and an upper end of the third electrode at the front surface side of the semiconductor part;

the upper end of the third electrode is positioned between the first portion of the control electrode and the end of the insulating space; and the second insulating film plugs an opening communicating with the end of the insulating space, the opening being provided between the control electrode and the semiconductor part.

Note 10: The device according to note 9, wherein the insulating space is a cavity provided between the semiconductor part and the third electrode.

Note 11: The device according to note 9 or 10, wherein the first insulating film extends between the control electrode and the end of the insulating space.

Note 12: The device according to any one of notes 1 to 11, further comprising a third insulating film provided between the insulating space and the semiconductor part; and a fourth insulating film provided between the insulating space and the third electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and overview of the invention.

What is claimed is:

1. A semiconductor device, comprising:

a semiconductor part;

a first electrode provided on a back surface of the semiconductor part;

a second electrode provided on a front surface of the semiconductor part at a side opposite to the back surface;

a third electrode provided between the first electrode and the second electrode, the third electrode extending into the semiconductor part from the front surface side of the semiconductor part, the third electrode being electrically insulated from the semiconductor part via an insulating space between the semiconductor part and the third electrode; and a control electrode including a first portion and a second portion, the first portion being linked to the second portion at the front surface side of the semiconductor part and extending between the semiconductor part and the third electrode, the second portion being provided between the second electrode and the third electrode, the first portion facing the insulating space via the third electrode, the second portion extending between the insulating space and the second electrode; and a first insulating film provided between the semiconductor part and the control electrode, the first insulating film electrically insulating the control electrode from the semiconductor part, a dielectric constant of the insulating space being less than a dielectric constant of the first insulating film.

2. The device according to claim 1, wherein a first distance from the first electrode to the third electrode is less than a second distance from the first electrode to the control electrode.

3. The device according to claim 1, wherein the control electrode includes a plurality of the first portions apart from each other.

4. The device according to claim 1, wherein the semiconductor part includes a first semiconductor layer of a first conductivity type, a second semiconductor layer of a second conductivity type, and a third semiconductor layer of the first conductivity type, the first semiconductor layer extends between the first electrode and the second electrode, the third electrode extending inside the first semiconductor layer and facing the first semiconductor layer via the insulating space, the second semiconductor layer is provided between the first semiconductor layer and the second electrode and faces the first portion of the control electrode via the first insulating film, and the third semiconductor layer is provided between the second semiconductor layer and the second electrode and is in contact with the first insulating film.

5. The device according to claim 4, wherein the semiconductor part further includes another second semiconductor layer facing the insulating space.

6. The device according to claim 1, wherein the first insulating film extends between the control electrode and the third electrode and electrically insulates the control electrode from the third electrode.

7. The device according to claim 1, further comprising:

a second insulating film provided between the second electrode and the control electrode, the second insulating film electrically insulating the control electrode from the second electrode.

8. The device according to claim 7, wherein the insulating space has an end positioned between the semiconductor part and an upper end of the third electrode at the front surface side of the semiconductor part, the upper end of the third electrode is positioned between the first portion of the control electrode and the end of the insulating space, and the second insulating film plugs an opening communicating with the end of the insulating space, the opening being provided between the control electrode and the semiconductor part.

9. The device according to claim 8, wherein the insulating space is a cavity provided between the semiconductor part and the third electrode.

10. The device according to claim 8, wherein the first insulating film extends between the control electrode and the end of the insulating space.

11. The device according to claim 1, further comprising:

a third insulating film provided between the insulating space and the semiconductor part; and a fourth insulating film provided between the insulating space and the third electrode.

12. The device according to claim 1, wherein the first portion of the control electrode is provided on one side of the third electrode in a direction perpendicular to a direction from the first electrode toward the second electrode; and a distance between the first electrode and an upper end of a portion of the insulating space disposed on the one side of the third electrode is shorter than a distance between the first electrode and an upper end of a portion of the insulating space disposed on the other side of the third electrode.

13. A semiconductor device, comprising:

a semiconductor part;

a first electrode provided on a back surface of the semiconductor part;

a second electrode provided on a front surface of the semiconductor part at a side opposite to the back surface;

a third electrode provided between the first electrode and the second electrode, the third electrode extending into the semiconductor part from the front surface side of the semiconductor part, the third electrode being electrically insulated from the semiconductor part via an insulating space between the semiconductor part and the third electrode; and a control electrode including a plurality of the first portions and a second portion, the plurality of first portions being linked to the second portion and extending between the semiconductor part and the third electrode from the front surface side of the semiconductor part, the second portion being provided between the second electrode and the third electrode, the plurality of first portions facing the insulating space via the third electrode, the second portion extending between the insulating space and the second electrode, the plurality of first portions of the control electrode being arranged along the front surface of the semiconductor part, the third electrode further extending in an arranging direction of the plurality of first portions, and a first insulating film provided between the semiconductor part and the control electrode, the first insulating film electrically insulating the control electrode from the semiconductor part, a dielectric constant of the insulating space being less than a dielectric constant of the first insulating film.

14. The device according to claim 13, wherein the plurality of first portions of the control electrode is arranged at both sides of the third electrode.

15. A method for manufacturing a semiconductor device, the method comprising:

forming a trench in a front side of a semiconductor wafer;

forming a sacrificial film at the front side of the semiconductor wafer, the sacrificial film covering an inner surface of the trench so that a first space remains inside the trench;

forming an electrode in the first space, the electrode extending into the trench from an opening side of the trench;

forming a control electrode including a first portion and a second portion, the first portion being linked to the second portion and extending between the semiconductor wafer and the electrode, the second portion being provided at the opening side of the trench and covering the electrode and the sacrificial film, the sacrificial film including a first end and a second end, the first end being positioned under the first portion of the control electrode, the second end facing the second portion of the control electrode, an upper end of the electrode being positioned between the first portion of the control electrode and the second end of the sacrificial film;

forming a first insulating film inside the trench, the first insulating film remaining between the control electrode and the semiconductor wafer and between the control electrode and the electrode, the first insulating film electrically insulating the control electrode from the semiconductor wafer and the electrode; and selectively removing the sacrificial film via an opening between the semiconductor wafer and the second portion of the control electrode, wherein a dielectric constant of an insulating space formed by selectively removing the sacrificial film is less than a dielectric constant of the first insulating film.

16. The method according to claim 15, wherein the first insulating film extends between the second portion of the control electrode and the second end of the sacrificial film and between the semiconductor wafer and the second portion of the control electrode, and the opening between the semiconductor wafer and the second portion of the control electrode is formed by selectively removing the first insulating film.

17. The method according to claim 15, wherein the insulating space is a cavity provided between the semiconductor wafer and the electrode.

18. The method according to claim 15, wherein:

the first portion of the control electrode is provided on one side of the electrode in a direction perpendicular to a direction from a first electrode provided on a back surface of the semiconductor wafer toward a second electrode provided on a front surface of the semiconductor wafer at a side opposite to the back surface; and a distance between the first electrode and an upper end of a portion of the insulating space disposed on the one side of the electrode is shorter than a distance between the first electrode and an upper end of a portion of the insulating space disposed on the other side of the electrode.

* * * * *